(12) United States Patent
Mårtensson et al.

(10) Patent No.: US 11,364,520 B2
(45) Date of Patent: Jun. 21, 2022

(54) METHOD FOR TRANSFERRING NANOWIRES FROM A FLUID TO A SUBSTRATE SURFACE

(71) Applicant: ALIGNEDBIO AB, Lund (SE)

(72) Inventors: Niklas Mårtensson, Lund (SE); Jaime Castillo Leon, Lund (SE)

(73) Assignee: ALIGNEDBIO AB, Lund (SE)

( * ) Notice: Subject to any disclaimer, the term of this patent is extended or adjusted under 35 U.S.C. 154(b) by 0 days.

(21) Appl. No.: 17/173,594

(22) Filed: Feb. 11, 2021

(65) Prior Publication Data

US 2021/0237117 A1    Aug. 5, 2021

Related U.S. Application Data

(63) Continuation of application No. 16/305,033, filed as application No. PCT/EP2017/064297 on Jun. 12, 2017, now Pat. No. 10,919,074.

(30) Foreign Application Priority Data

Jun. 21, 2016  (EP) .................................... 16175593

(51) Int. Cl.
*B05D 1/20* (2006.01)
*B82Y 40/00* (2011.01)
(Continued)

(52) U.S. Cl.
CPC ............... *B05D 1/202* (2013.01); *B05D 7/24* (2013.01); *H01L 31/035227* (2013.01);
(Continued)

(58) Field of Classification Search
None
See application file for complete search history.

(56) References Cited

U.S. PATENT DOCUMENTS

| 7,105,052 B1 | 9/2006 | Schlenoff |
| 10,037,831 B2 | 7/2018 | Garting et al. |

(Continued)

FOREIGN PATENT DOCUMENTS

| CN | 101803035 A | 8/2010 |
| JP | 2011504291 A | 2/2011 |

(Continued)

OTHER PUBLICATIONS

JPO Office Communication, First Office Action for Japanese Patent Application No. 2018-563433, dated May 28, 2021, 3 pages.

(Continued)

*Primary Examiner* — Alexander M Weddle
(74) *Attorney, Agent, or Firm* — The Marbury Law Group PLLC (57) ABSTRACT

A method for transferring an assembly of oriented nanowires from a fluid to a substrate surface, comprising: providing (FIG. 2A) a fluid to a container, said fluid comprising a first liquid (11), a second liquid (12) and a plurality of nanowires (25), wherein the first and second liquids phase separate into a sub phase, a top phase, and an interface (13) between the sub phase and the top phase; wherein the nanowires are functionalized to align vertically into a nanowire aggregate at the interface; wherein the fluid is provided with a substance in a composition configured to change the composition of the top phase or the composition of the sub phase to counteract bulging of the interface (FIG. 2B); and bringing the nanowire aggregate into contact with a substrate surface such that a majority of the nanowires are aligned with respect to each other on the substrate.

20 Claims, 4 Drawing Sheets

(51) Int. Cl.
  *B05D 7/24* (2006.01)
  *H01L 31/0352* (2006.01)
  *H01L 31/068* (2012.01)
  *H01L 31/18* (2006.01)
(52) U.S. Cl.
  CPC .... *H01L 31/035281* (2013.01); *H01L 31/068* (2013.01); *H01L 31/18* (2013.01)

(56) References Cited

U.S. PATENT DOCUMENTS

| | | |
|---|---|---|
| 2010/0092809 A1 | 4/2010 | Drzal et al. |
| 2011/0177683 A1 | 7/2011 | Kahen et al. |
| 2011/0253982 A1 | 10/2011 | Wang et al. |
| 2017/0047460 A1 | 2/2017 | Naseem et al. |
| 2017/0358448 A1 | 12/2017 | Naseem et al. |
| 2020/0316640 A1 | 10/2020 | Martensson et al. |

FOREIGN PATENT DOCUMENTS

| | | | |
|---|---|---|---|
| JP | 2013-517123 A | 5/2013 | |
| JP | 2013526474 A | 6/2013 | |
| KR | 20100128977 A | 12/2010 | |
| KR | 10-2012-0127599 A | 11/2012 | |
| WO | WO2008072479 A1 | 6/2008 | |
| WO | WO2011087913 A1 | 7/2011 | |
| WO | WO20120051482 A2 | 4/2012 | |
| WO | WO2013154490 A2 | 10/2013 | |
| WO | WO2014096962 A2 | 6/2014 | |
| WO | WO2015-166416 A1 | 11/2015 | |
| WO | WO-2015166416 A1 * | 11/2015 | ............. B82Y 10/00 |
| WO | WO-2016071762 A1 * | 5/2016 | ....... H01L 21/02603 |
| WO | WO2016071762 A1 | 5/2016 | |
| WO | WO2013080174 A1 | 6/2016 | |

OTHER PUBLICATIONS

International Search Report and written Opinion for PCT/EP2017/064297, dated Aug. 9, 2017.
Cheng et al: "Film Climbing of particle-Laden interfaces" Colloids and Surfaces A: Physiochemical and Engineering Aspects, Elsevier, vol. 315, No. 1-3, Dec. 24, 2007, pp. 275-284.
Chengyi Zhang et al.: "Facile One-Step Fabrication of Ordered Organic Nanowire Films" Advanced Materi-Als, vol. 21, No. 41, Nov. 6, 2009, pp. 4172-4175.
Wang M C P et al.: "Directed Assembly of Nanowires" Materials Today, vol. 12, No. 5, May 1, 2009, pp. 34-43.
International Preliminary Report on Patentability from the International Bureau for International Patent Application No. PCT/IB15/02227, dated May 18, 2017, 7 pages.
Jinyao Tang et al: "Solution-processed core-shel 1 nanowires for efficient photovoltaic cells", Nature Nanotechnology, vol. 6, No. 9, Jun. 22, 2011, pp. 568-572.
Maoqing Yao et al: "GaAs Nanowire Array Solar Cells with Axial p-i-n Junctions" Nano Letters, vol. 14, No. 6, Jun. 11, 2014, pp. 3293-3303.
Thomas J. Kempa et al: "Single and Tandem Axial p-i-n Nanowire Photovoltaic Devices" Nano Letters, vol. • 8, No. 10, Oct. 8, 2008, pp. 3456-3460.
Josef A. Czaban et al: "GaAs Core-Shell Nanowires for Photovoltaic Applications", Nano Letters, vol. 9, No. 1, Jan. 14, 2009, pp. 148-154.
Office Action from Japan Patent Office for Japanese Patent Application No. 2017-524430, dated Jun. 29, 2018, 9 pages.
Goto, H. et al., "Growth of Core-Shell InP Nanowires for Photovoltaic Application by Selective-Area Metal Organic Vapor Phase Epitaxy", Applied Physics Express, vol. 2, p. 035004-1-035004-3, (2009).
Adachi, M.M. et al., "Core-shell silicon nanowire solar cells", Scientific Reports, vol. 3, pp. 1-6, (2013).
First Office Communication from the State Intellectual Property Office for PRC (China) Patent Application No. 201580066524.3, dated Aug. 3, 2018, 15 pages.
Tang, J. et al., "Solution-processed core-shell Nanowires for efficient Photovoltaic cells," Abstract of Nature Nanotechnology, vol. 6, No. 9, pp. 568-572, 1 page, (2011).
Yao, M. et al., Ming Hsieh Department of Electrical Engineering and Center for Energy Nanoscience, "GaAs Nanowire Array Solar Cells with Axial p-i-n Junctions," NANO Letters, vol. 14, No. 6, pp. 3293-3303, 2 pages, (2014).
Korean Intellectual Property Office (KIPO) Office Communication, Notification of Reason for Refusal for Korean Patent Application No. 2018-7035784 dated Nov. 22, 2021, 17 pages including Machine Translation.

* cited by examiner

METHOD FOR TRANSFERRING NANOWIRES FROM A FLUID TO A SUBSTRATE SURFACE

CROSS-REFERENCE TO RELATED APPLICATIONS

This application is a continuation of U.S. patent application Ser. No. 16/305,033, filed Nov. 27, 2018, which is a U.S. national phase application under 35 U.S.C. § 371 of international application PCT/EP17/64297, filed Jun. 12, 2017, which claims benefit of European Patent Application No. 16175593.9, filed on Jun. 21, 2017.

FIELD OF THE INVENTION

The present invention relates to the formation of nanowire devices and in particular to capturing and aligning of nanowires to make nanowire devices. More specifically, this disclosure is related to methods for transferring oriented nanowires from a fluid to a substrate surface.

BACKGROUND

Conventional technologies for capturing nanostructures on a surface focus on the alignment and capture/deposition of nanostructures with a low length/diameter ratio (e.g.: nanorods, nanoparticles). However, capture and alignment of nanostructures with appreciable length/diameter ratio (e.g. nanowires) is more difficult. It is also difficult to align nanowires with a preferential direction. Conventional technologies use external controls (e.g., applied electric fields, slow solvent evaporation or thermal annealing) which may require the use of external equipment or high voltages to obtain the alignment and capture/deposition of nanostructures. These external controls increase the production cost and decrease the scalability of nanowire device production.

Applicant's previous application, published as WO2015/166416A1, discloses a method for capturing and aligning an assembly of nanowires from a liquid interface onto a surface including providing a first liquid and a second liquid, wherein the first and second liquids phase separate into a sub phase, a top phase and an interface between the sub phase and the top phase. The nanowires are provided such that the majority of the nanowires are located at the interface and providing the nanowires onto a substrate such that a majority of the nanowires are aligned with respect to each other on the substrate.

There still exists room for improvement in the arts of providing a suitable assembly of nanowires, and for capturing the assembly on a substrate surface. More specifically, improvements are desired for obtaining higher quality in the process of transferring a nanowire aggregate from a fluid to a substrate surface, and also in the perfection level of the resulting substrate.

SUMMARY

Solutions are presented herein, which address problems related to transferring an assembly of nanowires to a substrate surface. One embodiment is drawn to a method for transferring an assembly of oriented nanowires from a fluid to a substrate surface, comprising: providing a fluid to a container, said fluid comprising a first liquid, a second liquid and a plurality of nanowires, wherein the first and second liquids phase separate into a sub phase, a top phase, and an interface between the sub phase and the top phase; wherein the nanowires are functionalized to align vertically into a nanowire aggregate at the interface; wherein said fluid is provided with a substance in a composition configured to counteract bulging of the interface; and bringing the nanowire aggregate into contact with a substrate surface such that a majority of the nanowires are aligned with respect to each other on the substrate.

Further detailed solutions are provided in the claims.

DETAILED DESCRIPTION

Various embodiments will be described below with reference to the drawings. The embodiments are to be seen as exemplary, and other ways of realizing the solutions provided within the scope of the claims are therefore foreseeable.

The invention relates generally to the forming of an aggregate of a nanowire assembly of nanowires which are aligned, preferably in a common direction, at an interface which is formed between substantially immiscible first and second liquids of a fluid. This fluid containing nanowires may be formed in various ways, e.g. by first combining the first and second liquids and thereafter add the nanowires, or by adding the nanowires to one of the liquids before combining it with the other liquid. Suitably functionalized nanowires will then prone to assemble at the interface. However, the art of capturing aligned nanowires on a substrate surface from such a fluid interface has still been associated with a number of hurdles, and there is a desire in raising the quality of such nanowire substrates, in terms of e.g. nanowire alignment, orientation and surface density. The inventors have realized that a solution for increasing this quality is to prepare the fluid composition such that the nanowire aggregate is suitably formed at the interface. Furthermore, the fluid is provided with a substance in a composition configured to counteract bulging of the interface. This may in various embodiments be obtained by selectively arranging the composition of that substance, such as by careful selection of the type of substance and its concentration. This way, the interface is stretched out, so as to be substantially planarized for suitable engagement with a planar substrate surface. In other embodiments, the fluid composition may be modified in a subsequent step, after allowing the interface to form in the fluid, by addition of the substance in a composition such that the interface is stretched out to be substantially planarized for suitable engagement with a planar substrate surface. In this context, planarization aims at the effect of minimizing or decreasing bulging or bellying of an upper phase into a lower phase, i.e. increasing the curvature radius of the interface in a vertical plane. In the extreme case, this would mean going from a state where the second, top phase, liquid may be suspended as substantially spherical droplets at the surface of the first liquid 11, to a state where the second liquid floats on top of the first, sub phase, liquid with a substantially horizontal interface. Various embodiments and aspects will now be described.

Figure 1A:
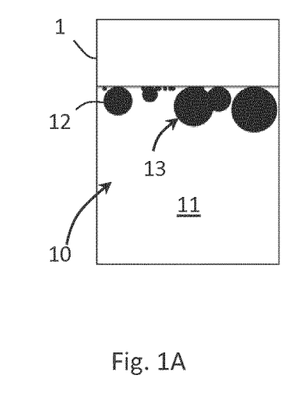
FIGS. 1A to 1D schematically illustrate various steps of a method of capturing and aligning an assembly of nanowires according to an embodiment.

With reference to FIG. 1A, an embodiment of the method uses a first liquid 11 located in a container 1 and a nanowire dispersion 12, constituting a second liquid 12, that is added to the first liquid 11. The nanowire dispersion 12 is preferably made by dispersing prefabricated nanowires 20 in a dispersion liquid. That is, the nanowires are fabricated prior to being added to the dispersion fluid 12 in contrast to in-situ formed nanowires in the dispersion fluid. In this embodiment, the dispersion liquid 12 is selected such that the nanowire dispersion is immiscible or only partially miscible in the first liquid 11. In this manner, when the nanowire dispersion is added to the first liquid 11, the first liquid 11 and the dispersion liquid 12 phase separate, creating a two phase liquid system. The denser liquid 11 settles to the bottom of the container 1 forming a sub phase, while the less dense liquid 12 floats on top of the first liquid 11 creating a top phase. The resulting two-phase system has a top phase and a sub phase and an interface 13 between the top phase and the sub phase.

In an embodiment, the nanowires 20 in the nanowire dispersion may be made of the same material. Alternatively, the nanowire dispersion 12 may include nanowires made of different materials. Nanowire materials suitable for use in the present embodiment and the embodiments below include metals (such as gold silver and alloys thereof), carbon nanowires or nanotubes (single wall and multiwall), semiconductors, including III-V (including binary, ternary and quaternary III-V semiconductors made of Al, In, Ga, N, P, As, such as GaAs and InP) and II-VI semiconductors (including binary, ternary and quaternary II-VI semiconductors made from Zn, Cd, Se, O, S, Te, such as ZnO, CdSe) and ceramics. The nanowires 20 may be used as received or be subjected to one or more surface treatments described in more detail below.

After adding the nanowire dispersion to the first liquid 11, the majority of the nanowires are then assembled at the interface. Typically, the nanowires spontaneously assemble at the interface, that is, the nanowires self-align at the interface, if given sufficient time. However, the nanowires may be subjected to one or more conditions that promote or accelerate the assembly of the nanowires at the interface. Acceleration may be accomplished in several ways. For example, acceleration may be accomplished by changing the composition of the top phase, the composition of the sub phase or altering the temperature of the container.

In another embodiment, rather than adding the nanowire dispersion to the first liquid 11, the two phase liquid system is formed first followed by adding nanowires to the system. Thus, a second liquid 12, different from the first liquid 11, may be added to the first liquid 11. Preferably, the second liquid 12 is immiscible or partially miscible/partially immiscible in the first liquid 11. In this manner and similar to the previous embodiment, when the second liquid 12 is added to the first liquid 11, the two liquids phase separate, creating a two-phase liquid system. The denser liquid settles to the bottom of the container, while the less dense liquid floats on top of the first liquid 11, resulting in a two-phase system with a top phase, a sub phase and an interface 13 between the top and sub phases. In this embodiment, the nanowires or a nanowire dispersion may be added to the two-phase system or added to the first liquid 11 prior to adding the second liquid 12 to the first liquid 11. A nanowire dispersion comprises nanowires distributed in a dispersion liquid (e.g. a solvent). The dispersion liquid may be the same as either the first liquid 11 or the second liquid 12. Alternatively, the dispersion liquid may be a third liquid that is different from both the first and second liquids. Alternatively, dry nanowires may be added.

In an embodiment, the nanowires may be functionalized with either compounds that render the nanowires hydrophobic (including alkanes, fluoro-compounds (such as Pentanethiol, perfluorodecane thiol, dodecyltrichlorosilane, stearic acid, decyl phosphonic acid, 5-(1,2-dithiolan-3-yl)-N-dodecylpentanamide, sodium dodecyl sulfate, triphenyl phosphine, octadecylthiol)) and/or hydrophilic (including sulphates, phosphates, carboxylates, amines, polyethers, (such as sodium mercaptopropane sulfonate, sodium mercaptoethane sulfonate, mercaptoalkane succinate (2-mercaptosuccinate), mercaptoalkane amine, (11-mercaptoundecyl)-N,N,N-trimethylammonium bromide, (12-Phosphonododecyl)phosphonic acid, (±)-1,2-Dithiolane-3-pentanoic acid, (2-Ammonioethyl)di-tert-butylphosphonium bis(tetrafluoroborate), (3-Aminopropyl)triethoxysilane, 12-mercaptododecanoic acid)). In an embodiment, one part of the nanowire surface is rendered hydrophobic and the other part of the nanowire surface is rendered hydrophilic using different functionalizing compounds to achieve the vertical alignment at the liquid interface. In an alternative embodiment, only one part of the nanowire surface is treated with a functionalizing compound.

Figure 3:
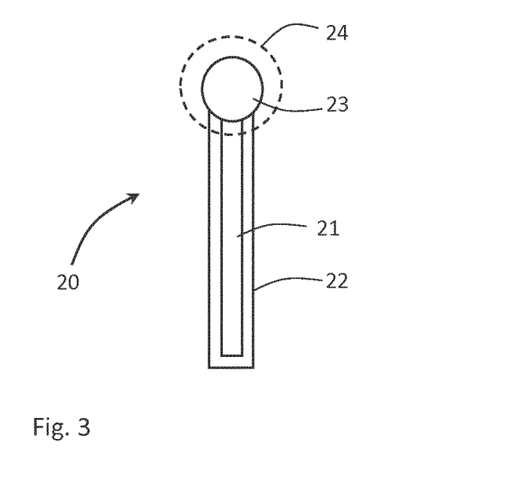
FIG. 3 is a schematic illustration of a functionalized nanowire according to an embodiment.

FIG. 3 is a schematic illustration of a functionalized nanowire 20 according to an embodiment. As illustrated, the nanowire 20 includes a nanoparticle 23, e.g. a metal particle such as a gold nanoparticle, at one end of the nanowire 20. The nanoparticle 23 may be a result of the growth process of the wire portion 21 (e.g. semiconductor portion) of the nanowire 20, such as when growing nanowires 20 by the vapor-liquid-solid (VLS) process using the nanoparticle 23 as a catalyst seed. Example processes for making nanowires 20 can be found in U.S. provisional application 61/623,137 filed on Apr. 12, 2012 and PCT published application number WO13/154490 A2, hereby incorporated by reference in their entirety. In an embodiment, a first functionalizing compound 24 is attached to one end of the nanowire 20, such as to the nanoparticle 23. A second, different functionalizing compound (not shown) may be attached to the second end of the nanowire that lacks the nanoparticle 23. The functionalizing compound(s) 24 aid in aligning the nanowires 20 in the top 104 and bottom 102 phases. As discussed in more detail below in regards to specific examples, one of the functionalizing groups may be 1-octadecanethiol (ODT), while a component attached to the lower end of the nanowire 20 may be (12-phosphonododecyl)phosphonic acid (PPA). Further, the functionalizing compound 24 may have a functional group, or a different one at each ends of the functionalizing compounds 24. Various types of functionalizing components and examples of such types are given in Table I of applicant's own prior application WO2015/166416, hereby incorporated by reference in their entirety.

Based on the choice of functionalizing compounds 24 and the type and composition of the liquids 11, 12, the orientation and alignment of the nanowires may be controlled. In a similar manner, these parameters/compositional variables may allow the nanowire-nanowire interspacing to be varied, resulting in assemblies with different (i.e. pre-selected) densities (e.g. density of nanowires per square micron). The nanowire-nanowire interspacing can be deduced from the percentage of surface area covered after the capture of the aligned nanowires on the substrate.

In one embodiment, appropriate formation of a nanowire aggregate at the interface 13 can be obtained with a dispersion of nanowires 20 in a liquid 12 comprising a component selected from the group comprising one or more of toluene, hexane, octane, cyclohexane, cyclopentanone a thiol such as 1-octadecanethiol and polyethyleneimine. In a preferred embodiment, the nanowires are functionalized with a component 24 of the second liquid 12. The functionalizing component may comprise an atom or atoms prone to attach to the seed particle 23, e.g. sulfur, and further a molecule chain providing hydrophobic properties to the functionalized nanowire 20.

In a preferred embodiment, functionalization is carried out in a separate step, prior to adding the nanowire dispersion to the first liquid 11. In one embodiment, functionalization may be carried out by mixing a solution of the functionalizing component with an added amount of nanowires. An object at this point is adsorption of the functionalizing component only to the nanoparticle 23, typically a gold particle, in order to make the particle 23 highly hydrophobic, increasing in this way the Janus properties of the nanowire. Additionally, the inventors have found indications that covering the metal nanoparticle 23 with adhered molecules of the functionalizing component will decrease the surface charge density of the particle, which also results in a decrease in its electrostatic repulsive force. In this way, a close-packed assembly of nanowires in the aggregate 25 will be favorable.

Figure 4:
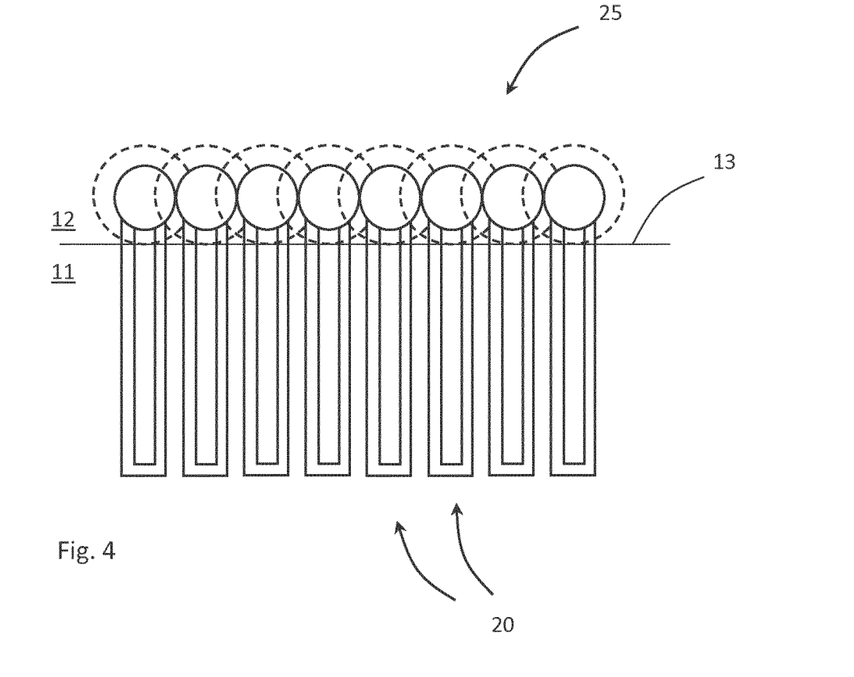
FIG. 4 is a schematic illustration of an aggregate of aligned and assembled nanowires according at a fluid interface according to an embodiment.

In one embodiment, the nanowires 20 may be provided with a dielectric surface coating 22 about the wire portion 21. The dielectric surface coating 22 may e.g. comprise silica or aluminum oxide. With proper selection of the first liquid 11, the coated nanowire surface may be suitably wetted in the first liquid 11. This way, proper selection of the liquid composition of both the first liquid 11 and the second liquid 12 will help promote the formation of a nanowire aggregate 25, as indicated in FIG. 4, in which all or nearly all nanowires 20 are correctly oriented, aligned, and densely packed. The first liquid 11 may have a composition comprising a concentration of first substance of at least one of acetone, acetonitrile, dimethyl sulfoxide, di ethylene glycol, and isopropyl alcohol. This first substance is provided to at a certain concentration in water, i.e. in an aqueous solution. By including this first substance to a certain concentration in the first liquid 11 in the sub phase the interfacial energy between the first liquid 11 and the second liquid 12, or air, is lowered and the nanowire surface charge density decreases. This contributes to the nanowires 20 predisposition to align vertically in the interface, and thus a tighter packing in the aggregate 25.

Figure 1B:
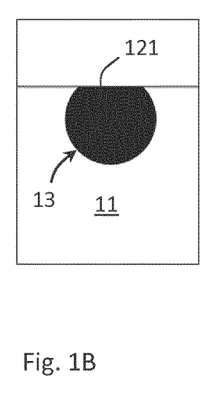

Once a suitable aggregate 25 of nanowires has formed at the interface 13, transfer of the aggregate to a substrate surface is to be carried out. However, due to the different characters of the liquids 11, 12, when a suitable composition for obtaining a tightly packed aggregate 25 of oriented and aligned nanowires 20 have been used, the fluid may look as in FIG. 1A. In a subsequent step, an additional amount of the second liquid 12 may then be added in one embodiment. This way, plural individual aggregates 25 may be affected to merge in to a single top phase 1, as shown in FIG. 1B. So, by first providing the second liquid 12 in a first amount, a larger overall interface (i.e. the sum of all aggregate 25 surfaces) will alleviate the transfer of nanowires from the bulk of the second fluid to capture at the interface 13. Later addition of a second amount of the second liquid 12, or an amount with similar properties as the second liquid 12, will assist in creating a single aggregate 25 with a contiguous interface 13.

Figure 2A:
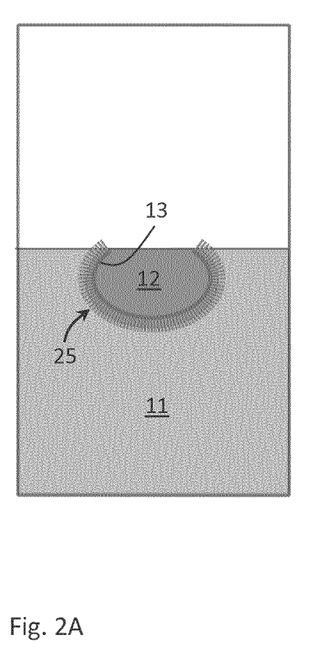
FIGS. 2A and 2B schematically illustrate a phase interface including a nanowire aggregate, before and after fluid substance modification according to an embodiment.

In one embodiment, the fluid may be provided by first providing the first liquid 11, and subsequently adding the second liquid 12 including a dispersion of nanowires 20 onto the surface of the first liquid 11. In one embodiment, this may be obtained by spraying the second fluid 12 including the nanowires 20 onto the first liquid 11. In such embodiments, a single top phase as shown in FIG. 1B or 2A may be obtained, while avoiding the droplet character of FIG. 1A.

In various embodiments, dependent on the selected properties of the liquids 11, 12, the interface 13, and hence the aggregate 25, may bulge towards the first liquid and have a severe curvature with a comparatively small radius, as indicated in both FIGS. 1A and 1B. This can also be seen in FIG. 2A, although it should be understood that this drawing is highly schematic, particularly with regard to the nanowire size in relation to the container. Transfer of the nanowires to a planar substrate may nevertheless be obtained, e.g. by pulling a substrate at an angle from the first liquid 11. However, for larger substrates such a process may not be suitable and/or may not provide a high-quality assembly of nanowires. In various embodiments, a level of quality of a film of nanowires may correlate with absence or a low level of holes, cracks, or nanowires vertically aligned at a different height, which are types of defects that may be important challenges in applications such as solar cells. According to preferred embodiments, this may be avoided or alleviated by providing the fluid with a substance in a composition configured to counteract bulging of the interface 13.

In one embodiment, this may be obtained by careful selection of the substance and its composition. The substance may be included in a composition which acts to increase the relative density of the sub phase with respect to the top phase. This may be obtained by including a substance to the second liquid in the top phase, such that its relative density is below a predetermined threshold compared to the sub phase. In an alternative embodiment, a careful configuration of the composition of the first liquid of the sub phase is rather obtained, by including an appropriate substance in a solvent.

In various embodiments, a step of modifying the fluid, such as modifying its substance composition, is carried out after the aggregate has formed at the interface 13, such that a curvature radius of the interface 13 is increased towards planarization.

In one embodiment, the modification of the fluid comprises changing the relative density relationship between the top phase and the sub phase. In one embodiment, this may be obtained by adding an auxiliary substance to the top phase, after formation of the contiguous aggregate 25 at the interface 13. As an example, hexane may be added to the top phase where the second liquid 12 is 1-octadecanethiol, such that the overall density of the modified top phase composition is decreased.

In an alternative embodiment, modifying the substance composition includes changing the composition of the sub phase subsequent to forming the nanowire aggregate. In such an embodiment, the composition of the sub phase may be changed so as to increase its density. This may be accomplished by adding an auxiliary component or substance to the first liquid 11 of the sub phase, so as to increase the density of the sub phase.

In one embodiment, the composition of the sub phase is changed by extracting an amount of the first liquid 11 from the sub phase, and subsequently adding an amount of liquid to the sub phase, wherein the added amount of liquid has a different composition than the extracted amount of liquid. This process has the benefit of ensuring that the composition of the added amount of liquid is properly mixed in the sub phase, since a prepared mixture of said different composition may be added to the sub phase.

In one embodiment, where the substance has higher density than its solvent, this process of changing the composition of the sub phase may include providing the first liquid 11 to the sub phase with a substance of a first concentration exceeding a first level prior to providing the nanowires to the fluid, and changing the substance concentration of the sub phase to below a second level, which is lower than the first level, after forming the nanowire aggregate. In an alternative of this embodiment, where the substance has lower density than its solvent, the process of changing the composition of the sub phase may include providing the first liquid 11 to the sub phase with a substance concentration not exceeding a first level prior to providing the nanowires to the fluid, and changing the substance concentration of the sub phase to above a second level, which is at least as high as the first level, after forming the nanowire aggregate. These embodiments haves a benefit of not requiring the addition of auxiliary components or substances, but only modifying the concentration of a first substance in the first liquid 11 of the sub phase.

Figure 1C:
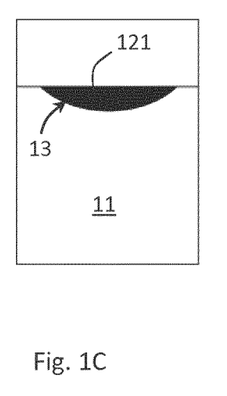
Figure 1D:
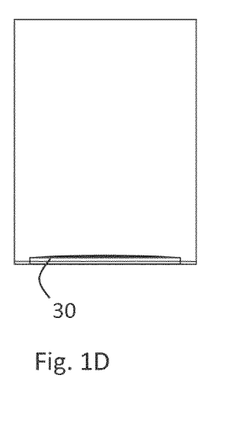
Figure 2B:
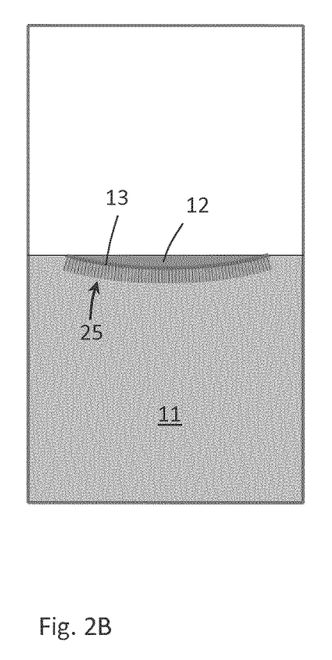

The inventors have realized that at least for certain types of liquids 11, 12, if the concentration of the first substance in the first liquid 11 is too high initially, the desired phase separation may not occur, and the nanowires 20 may disperse in the first liquid 11. On the other hand, if the concentration is too low, the nanowire aggregate 25 will not be properly formed with densely packed nanowires 20. In one embodiment, the first liquid 11 may initially contain said first substance in a concentration exceeding a first level A, so as to obtain proper wetting characteristics of the wire portion 21 of the nanowires 20 which preferably are coated 22. Dependent on specific choice of the first substance, the exceeded concentration level A may e.g. be 50%, or e.g. 70%, or e.g. 90%. In the step of modifying the composition of the fluid, the concentration of the first substance in the sub phase may be changed so as not to exceed a second level B, which may be the same or lower than the first level A. Dependent on specific choice of the first substance, the maximum concentration level B may e.g. be 50%, or e.g. 30%, or e.g. 10%. This embodiment may be suitably employed where the first substance in the first liquid 11 phase decreases the density of the sub phase, e.g. where the first substance is isopropyl alcohol or acetone. The modification to a lower concentration thus increases the density of the sub phase, which may contribute to planarizing the interface 13. The result of the modifying step may be seen in in the exemplary drawings of FIGS. 1C and 2B, respectively.

The inventors have also found the surprising effect that in various embodiments it is possible to provide the fluid with a substance in a composition configured to counteract bulging of the interface, by careful selection of the fluid from the outset. In one embodiment, the addition of hexane in the first liquid 11, in an aqueous solution of a certain concentration range, means that subsequent addition of the second liquid 12 of any of the aforementioned types may be accomplished while still minimizing bulging of the resulting interface 13. In various embodiments, hexane may be included in a concentration of 10-60%, such as 10-40%, or even 10-30%, and preferably <30%, with a positive planarizing effect.

A benefit of such a substantially planar shape of the nanowire aggregate, with little or no bulging, is that it makes it possible to transfer the aggregate to larger substrate surfaces up to several decimeters or more than a meter wide, without adding defects such as cracks or holes that might appear due to the difference in curvature between the aggregate of aligned NWs and the planar substrate, as will be described below. In addition, the embodiments of planarizing the interface 13 carrying the nanowire aggregate 25 by means of changing the composition of the fluid has the benefit of being very fast, substantially instantaneous, since it is a physical effect of the changed composition.

In the overall method of transferring an assembly of oriented nanowires from a fluid to a substrate surface, the step of bringing the nanowire aggregate 25 into contact with a substrate surface 31 is carried out such that a majority of the nanowires 20 are aligned with respect to each other on the substrate 30. In one embodiment, the floating aggregate 25 is captured using a suitable substrate, e.g. a piece of Si wafer. The substrate may be dipped into the fluid 10 close to the aggregate 25 at a certain angle, preferably not more than 30°, and carefully lifted in order to capture the formed nanowire array. Once the array 25 of vertically aligned nanowires 20 is captured, the sample, i.e. the substrate 30 provided with nanowires 20, may be kept inside a desiccator for some time in order to eliminate excess of solvent. In a subsequent step, the sample may be baked for an additional time to remove excess of the second liquid 12. After the baking step, the sample is covered with a planarization compound, e.g. Level M10, for filling gaps in between the standing nanowires 20 and creating a film where the nanowires are contained.

However, an alternative method for transferring the aggregate 25 to a substrate 30 is provided here, which is particularly suitable for larger substrates, e.g. larger than 2", up to 6" and more. Rather than "scooping" up the nanowire aggregate 25, a method of draining the sub phase is employed, such that the floating aggregate 25 is controlled to land on the surface 31 of a substrate 30, placed at the bottom of the container 1.

Figure 6:
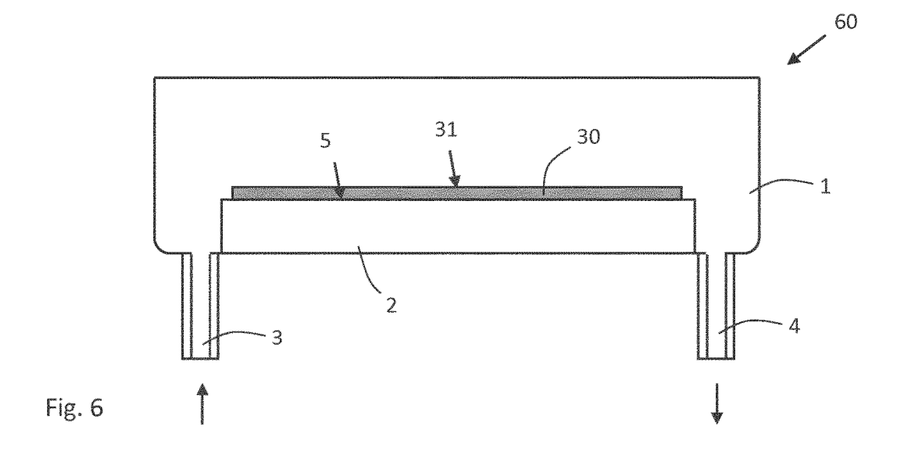
FIG. 6 is a schematic illustration of a container apparatus for transferring an assembly of oriented nanowires from a fluid to a substrate surface.

FIG. 6 schematically illustrates a container apparatus 60 for transferring an assembly of oriented nanowires from a fluid to a substrate surface in various embodiments. The apparatus 60 comprises a vessel or container 1, and be made of any material suitable for holding the first 11 and second liquids 12 of a fluid 10 as disclosed. The container may thus have inner walls of e.g. glass, or a metal. A support member 2 may be provided at an inner bottom part of the container 1, having a substantially horizontal support surface 5 for supporting a substrate 30. The support member may thus be planar or e.g. comprise a net structure or other shape, providing a substantially horizontal support surface 5. In one embodiment, the container apparatus 60 may comprise at least one port or conduit 3, 4, at least for adding a liquid substance to the inner of the container 1. More particularly, said port 3,4 is preferably provided below the substrate support surface 5 of the support member 2, such that liquid may be suitably injected to or extracted from a sub phase, as indicated in e.g. FIGS. 1 and 2. In one embodiment, separate ports 3 and 4 may be provided for injection of liquid to the sub phase, and for extraction of liquid from the sub phase.

Example substrates that may be used include, but are not limited to, silicon, glass, plastic, molybdenum, silane modified silicon, gold, thiol modified gold or silicon surfaces with physically adsorbed cationic polymers. The substrate surface may be used as-received (i.e. bare), e.g. a clean Si wafer, which may comprise an oxide layer. In an alternative embodiment, the surface of the substrate is functionalized. The functionalizing compound aids in securing the nanowires to the substrate surface. The surface of the substrate may be modified (e.g. functionalized) either by chemical reactions or physical adsorption of a functional species that includes specific functional groups. The assembly of nanowires may be transferred from the interface to the functionalized substrate surface as a result of electrostatic interactions between the aligned nanowires and a functionalized surface or as a result of van der Waals interactions between the nanowires and the substrate surface 31.

Figure 5:
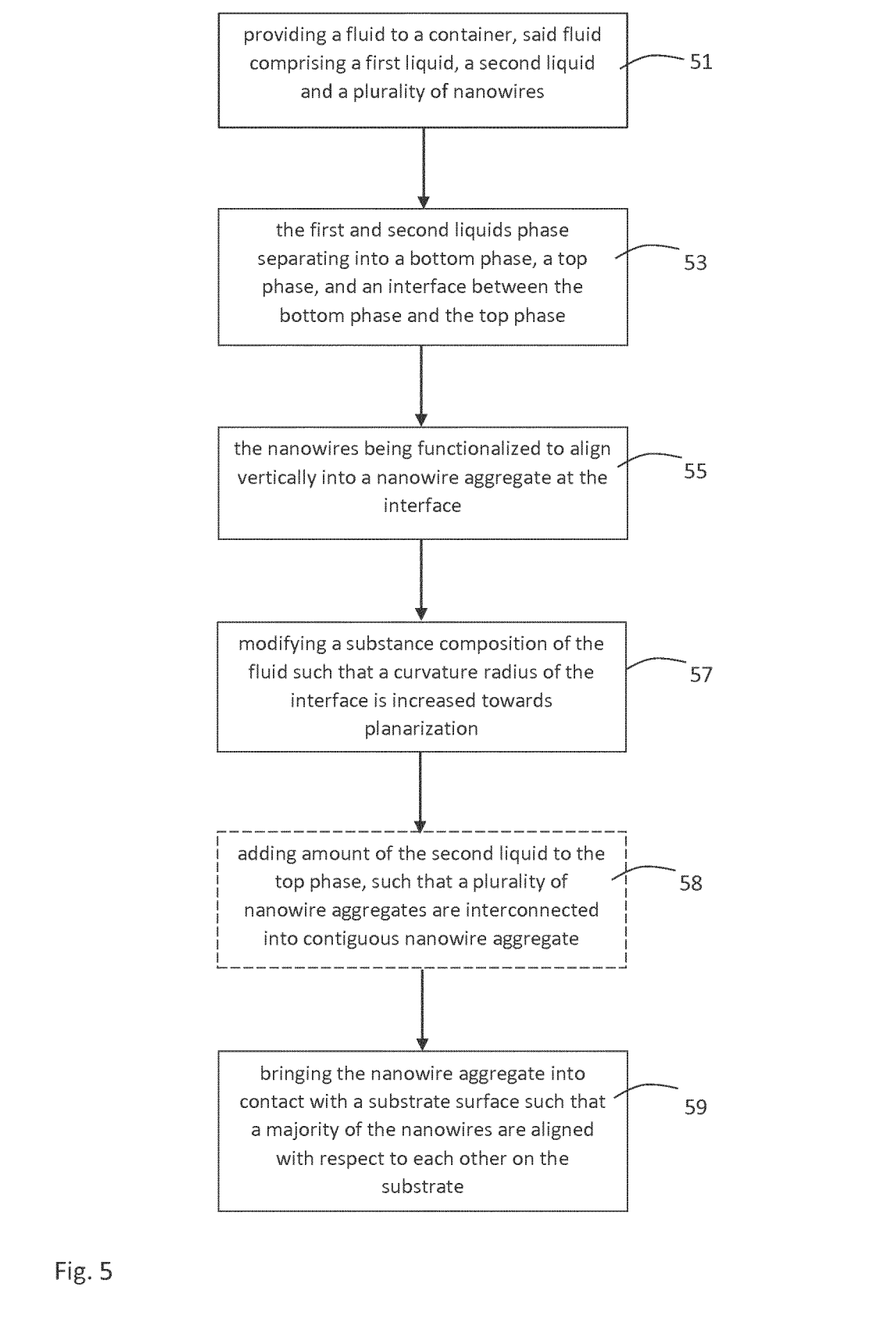
FIG. 5 is a schematic illustration of a method of transferring an assembly of oriented nanowires from a fluid to a substrate surface.

In one embodiment, a method may comprise the steps indicated in FIG. 5.

A first step 51 includes providing a fluid 10 to a container 1, said fluid comprising a first liquid 11, a second liquid 12 and a plurality of nanowires 20.

In a second step 53 the first 11 and second liquids 12 phase separating into a sub phase, a top phase, and an interface 13 between the sub phase and the top phase.

In accordance with a third step 55, the nanowires are functionalized to align vertically into a nanowire aggregate at the interface.

In a fourth step 57, a substance composition of the fluid is modified such that a curvature radius of the interface is increased towards planarization, in the sense that bulging of the interface is counteracted. As noted above, in alternative embodiments the effect of counteracting bulging may be obtained by providing the fluid with the substance composition from the outset, e.g. in the first liquid prior to adding the plurality of nanowires. In such an embodiment, step 57 would not be included as a separate step.

In an optional step 58, an additional amount of the second liquid may be added to the top phase, such that a plurality of nanowire aggregates 25 are interconnected into contiguous nanowire aggregate 25. Furthermore, this step may be carried out prior to step 57 in an alternative embodiment.

In a step 59, the nanowire aggregate is brought into contact with a substrate surface such that a majority of the nanowires are aligned with respect to each other on the substrate.

Measurements carried out on substrate samples prepared with the suggested method have shown very good results, and some test results are outlined in Table 1 below. The numbers therein indicate that a perfection level obtained using this method for transferring aligned and oriented nanowires from a fluid to a substrate surface is unprecedented.

Figures 7, 8:
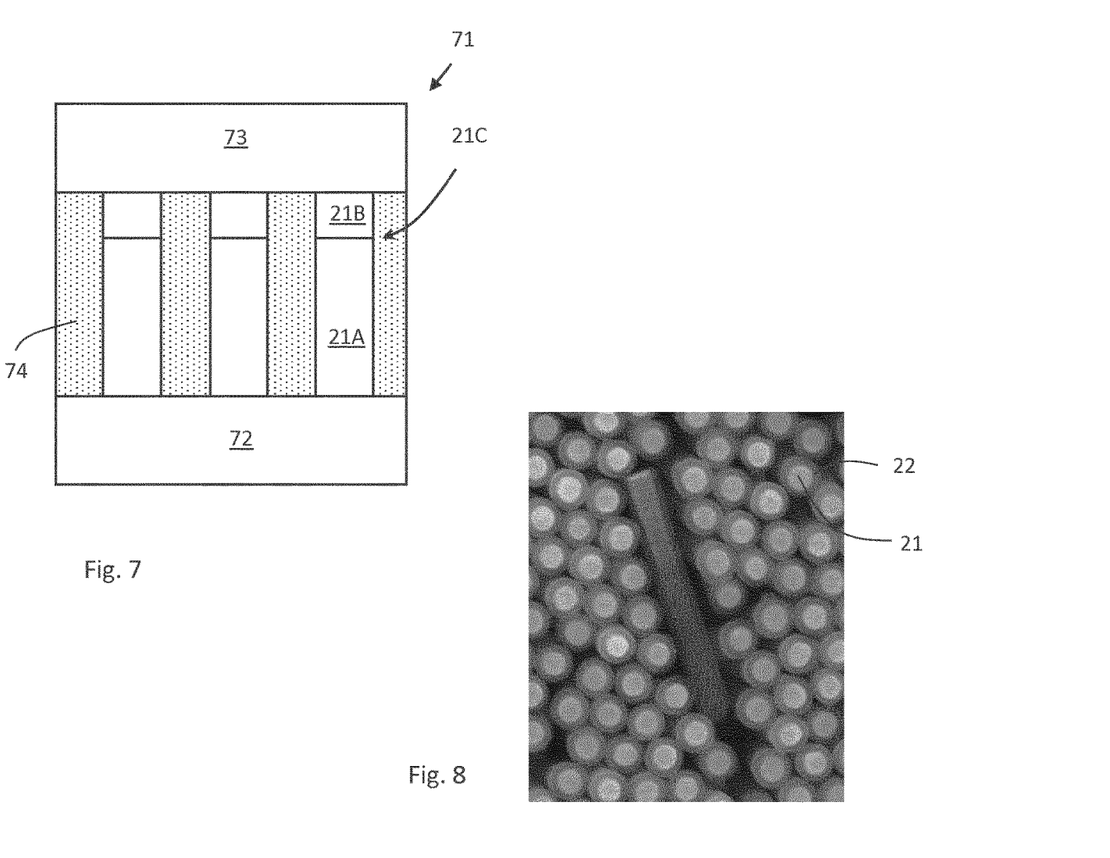
FIG. 7 is a schematic side cross sectional view of a nanowire device, e.g. a solar cell, according to an embodiment.
FIG. 8 is an image showing nanowires transferred to a substrate using a method as provided herein.

FIG. 8 shows an image of a sample of an assembly of nanowires 20 which have been transferred to a substrate 30, including one misaligned nanowire 20 which illustrates the aspect ratio of the nanowires 20.

TABLE 1

| Results of 246 measurements on 84 samples | | | |
|---|---|---|---|
| | Alignment | Orientation | Close packing |
| Mean | 94.4 | 98.4 | 58.3 |
| Std Dev | 11.1 | 2.3 | 17.2 |
| Std Err Mean | 0.7085 | 0.1482 | 1.0937 |
| Upper 95% Mean | 95.8 | 98.7 | 60.4 |
| Lower 95% Mean | 93.0 | 98.2 | 56.1 |
| N | 246 | 246 | 246 |

As can be seen from Table 1, 94.4% of the transferred nanowires are aligned within ±5 degrees from the normal direction. In addition, very close packing is obtained, where the number 58.3 indicates the surface density divided by theoretical max density of circles with diameter of the nanowire 21, which is the brighter center portion. This means a thicker shell or coating 22 will give a lower close packing value. In addition, the orientation obtained is 98.4%, meaning the relative number of nanowires ordered in the correct direction. These measurements have been obtained from samples ranging from 1-6".

In an embodiment, the substrate 30 with the captured assembly 25 of nanowires 20 can be placed into a solar cell 71 if the nanowires 20 have a pn junction, as shown in FIG. 7. It should be noted, though, that the substrate 72 illustrated in FIG. 7 may be the same substrate 30 to which the nanowire aggregate 25 was transferred, or a later substrate 72 connected to the opposing ends of the nanowires 20, after which the original substrate 30 is removed. Alternatively, substrate 72 may incorporate capture substrate 30, with additional layers or structures subsequently provided.

As schematically illustrated in FIG. 7, the substrate 72 may contain semiconductor (e.g., GaAs, InP, etc.) nanowires 20 positioned substantially perpendicular (e.g., with the longest axis 80 to 100 degrees, such as 90 degrees) to the upper substrate surface. The nanowires 20 in this embodiment have an axial pn junction 21CC located between a lower first conductivity type (e.g., n or p type) segment 21A and an upper second conductivity type (e.g., p or n type) segment 21B of the opposite conductivity type. In the solar cell 71, electrodes provide electrical contact to the nanowires 20. For example, the solar cell 71 may contain an upper electrode (e.g., transparent electrode) 73 in electrical contact with the upper segment 21B of the nanowires and an electrically conductive or semiconductor substrate 72 may provide an electrical contact to the lower segment 21A of the nanowires 20. An insulating or encapsulating material 74 may be located between the nanowires 20. Alternatively, the nanowires may contain a radial rather than an axial pn junction, in which case segment 21B is formed as a shell surrounding a nanowire core 21A such that the pn junction extends substantially perpendicular to the substrate capture surface.

Although the foregoing refers to particular preferred embodiments, it will be understood that the invention is not so limited. It will occur to those of ordinary skill in the art that various modifications may be made to the disclosed embodiments and that such modifications are intended to be within the scope of the claims. All of the publications, patent applications and patents cited herein are incorporated herein by reference in their entirety.

The invention claimed is:
1. A method for transferring an assembly of oriented nanowires from a fluid to a substrate surface, comprising:

providing a fluid to a container, said fluid comprising a first liquid, a second liquid and a plurality of nanowires, wherein the first and second liquids phase separate into a sub phase, a top phase, and an interface between the sub phase and the top phase; wherein the plurality of the nanowires are functionalized to align vertically into a nanowire aggregate at the interface providing a substrate in the container with the substrate surface substantially horizontal; and bringing the nanowire aggregate into contact with the substrate surface such that a majority of the plurality of nanowires are aligned with respect to each other on the substrate, wherein the step of bringing the nanowire aggregate into contact with a substrate surface comprises extracting liquid from the sub phase until the nanowire aggregate engages the substrate surface.

2. The method of claim 1, wherein the plurality of the nanowires are provided in the second liquid, prior to combining the second liquid with the first liquid.

3. The method of claim 1, further comprising adding a subsequent amount of the second liquid to the top phase, such that a plurality of nanowire aggregates are interconnected into a larger contiguous nanowire aggregate.

4. The method of claim 1, wherein the step of providing the fluid to the container comprises providing the plurality of the nanowires and the first fluid into the container prior to providing the second fluid into the container, followed by providing the second fluid into the container.

5. The method of claim 1, further comprising changing the composition of the sub phase subsequent to forming the nanowire aggregate.

6. The method of claim 5, wherein the composition of the sub phase is changed by extracting an amount of the first liquid from the sub phase, and adding an amount of liquid to the sub phase, wherein the added amount of liquid has a different composition than the extracted amount of liquid, to increase a density of the sub phase.

7. The method of claim 1, wherein the first fluid is immiscible with the second fluid.

8. The method of claim 1, wherein the first fluid is partially immiscible with the second fluid.

9. The method of claim 1, wherein:
the plurality of the nanowires comprise first nanowires made of a first material and second nanowires made of a second material different from the first material; and
the first nanowires comprise first semiconductor nanowires and the second nanowires comprise second semiconductor nanowires comprising a different semiconductor than the first nanowires.

10. The method of claim 9, wherein the first nanowires comprise first III-V semiconductor nanowires and the second nanowires comprise second III-V semiconductor nanowires comprising a different III-V semiconductor than the first nanowires.

11. The method of claim 10, the first nanowires comprise binary III-V semiconductor nanowires and the second nanowires comprise ternary III-V semiconductor nanowires.

12. The method of claim 1, wherein:
the plurality of the nanowires comprise first nanowires made of a first material and second nanowires made of a second material different from the first material; and
the first nanowires comprise GaP semiconductor nanowires and the second nanowires comprise different nanowires than the GaP semiconductor nanowires.

13. The method of claim 12, wherein the first and second nanowires have a dielectric surface coating.

14. The method of claim 13, wherein the dielectric surface coating comprises silica or aluminum oxide.

15. The method of claim 1, wherein the plurality of nanowires are provided with a metal catalyst particle at one end, and are functionalized by a compound comprising a molecule chain connecting to the catalyst particle.

16. The method of claim 15, wherein the molecule chain is a thiol connecting by a sulfur atom to the catalyst particle.

17. The method of claim 15, wherein the compound is 1-octadecanethiol or polyethyleneimine.

18. The method of claim 15, wherein the plurality of nanowires are functionalized with a compound of the second liquid.

19. The method of claim 1, wherein the substrate is provided on a support member in the container, and the liquid of the sub phase is extracted through a conduit connected to the container below the substrate surface.

20. A method for transferring an assembly of oriented nanowires from a fluid to a substrate surface, comprising:
providing a fluid to a container, said fluid comprising a first liquid, a second liquid and a plurality of nanowires, wherein the first and second liquids phase separate into a sub phase, a top phase, and an interface between the sub phase and the top phase, wherein the plurality of the nanowires are functionalized to align vertically into a nanowire aggregate at the interface and wherein the plurality of nanowires are functionalized with a compound of the second liquid; and
bringing the nanowire aggregate into contact with a substrate surface such that a majority of the plurality of nanowires are aligned with respect to each other on the substrate.

* * * * *